United States Patent
Xia et al.

(10) Patent No.: US 7,349,212 B2
(45) Date of Patent: Mar. 25, 2008

(54) HEAT DISSIPATION DEVICE

(75) Inventors: Wan-Lin Xia, Shenzhen (CN); Tao Li, Shenzhen (CN); Jun Zhang, Shenzhen (CN); Ji-Yun Qin, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 51 days.

(21) Appl. No.: 11/309,303

(22) Filed: Jul. 24, 2006

(65) Prior Publication Data

US 2008/0019094 A1 Jan. 24, 2008

(51) Int. Cl.
*H05K 7/20* (2006.01)
*F28F 7/00* (2006.01)

(52) U.S. Cl. .................. 361/697; 165/80.3; 165/121; 165/122; 165/104.33; 361/700; 361/703

(58) Field of Classification Search .............. 165/80.3, 165/104.33, 121, 122; 361/697, 703, 700
See application file for complete search history.

(56) References Cited

U.S. PATENT DOCUMENTS

| | | | |
|---|---|---|---|
| 6,698,499 B1 * | 3/2004 | Wagner et al. ............. 165/80.3 |
| 7,038,913 B2 * | 5/2006 | Lee et al. .................... 361/709 |
| 7,120,018 B2 * | 10/2006 | Shen et al. .................. 361/695 |
| 7,215,548 B1 * | 5/2007 | Wu et al. .................... 361/703 |
| 2002/0063328 A1 * | 5/2002 | Baek et al. ................. 257/706 |
| 2003/0121645 A1 * | 7/2003 | Wang .................... 165/104.26 |
| 2007/0097654 A1 * | 5/2007 | Hao et al. ................... 361/719 |
| 2007/0145572 A1 * | 6/2007 | Chen et al. ................. 257/718 |

\* cited by examiner

*Primary Examiner*—Gregory D Thompson
(74) *Attorney, Agent, or Firm*—Jeffrey T. Knapp

(57) ABSTRACT

A heat dissipation device includes a heat sink having a plurality of fins defining a plurality of passageways therebetween. The passageways have an inlet and an outlet at two sides of the heat sink. A fan is located at the inlet of the passageways of the heat sink for providing airflow to the heat sink. A guiding member is positioned at the outlet of the passageways of the heat sink for guiding the airflow to electronic components around the heat dissipation device. The heat sink defines a slot at a side thereof, the guiding member extends at least a fixing arm fixed to the heat sink and a tongue embedded into the slot of the heat sink, thereby attaching the guiding member to the heat sink.

15 Claims, 4 Drawing Sheets

HEAT DISSIPATION DEVICE

FIELD OF THE INVENTION

The present invention relates generally to heat dissipation devices, and more particularly to a heat dissipation device incorporating with a fan for dissipating heat generated by an electronic device.

DESCRIPTION OF RELATED ART

It is well known that, during operation of a computer, electronic devices such as central processing units (CPUs) frequently generate large amounts of heat. The heat must be quickly removed from the electronic device to prevent it from becoming unstable or being damaged. Typically, a heat dissipation device is attached to an outer surface of the electronic device to absorb heat from the electronic device. The heat absorbed by the heat sink is then dissipated to ambient air.

Generally, a heat dissipation device mainly comprises a heat conducting base and a plurality of heat dissipating fins extending from one face of the base. For enhancing the heat dissipation efficiency of the heat dissipation device, a fan is typically desired to be combined thereto to provide forced convection airflow to the fins of the heat dissipation device. In use, the base has a face opposite the fins attached to an electronic device to absorb heat generated by the electronic device; then, the heat reaches the fins to be dissipated to the ambient air. With the development of computer industry, electronic devices of the computer become more and more powerful. And more and more electronic devices need heat dissipation. Therefore, the heat dissipation device has being continuously improved to meet the demand of heat dissipation of electronic devices in the computer.

What is needed, therefore, is a heat dissipation device which has greater heat dissipating capacity for heat generating electronic devices.

SUMMARY OF THE INVENTION

A heat dissipation device in accordance with a preferred embodiment of the present invention comprises a heat sink comprising a plurality of fins defining a plurality of passageways therebetween. The passageways have an inlet and an outlet at two sides of the heat sink. A fan is located at the inlet of the passageways of the heat sink for providing airflow to the heat sink. A guiding member is positioned at the outlet of the passageways of the heat sink for guiding the airflow to electronic components around the heat dissipation device. The heat sink defines a slot at an side thereof, and the guiding member extends at least a fixing arm fixed to the heat sink and a tongue embedded into the slot of the heat sink, thereby attaching the guiding member to the heat sink.

Other advantages and novel features will become more apparent from the following detailed description of preferred embodiments when taken in conjunction with the accompanying drawings, in which:

DETAILED DESCRIPTION OF THE INVENTION

Figure 1:
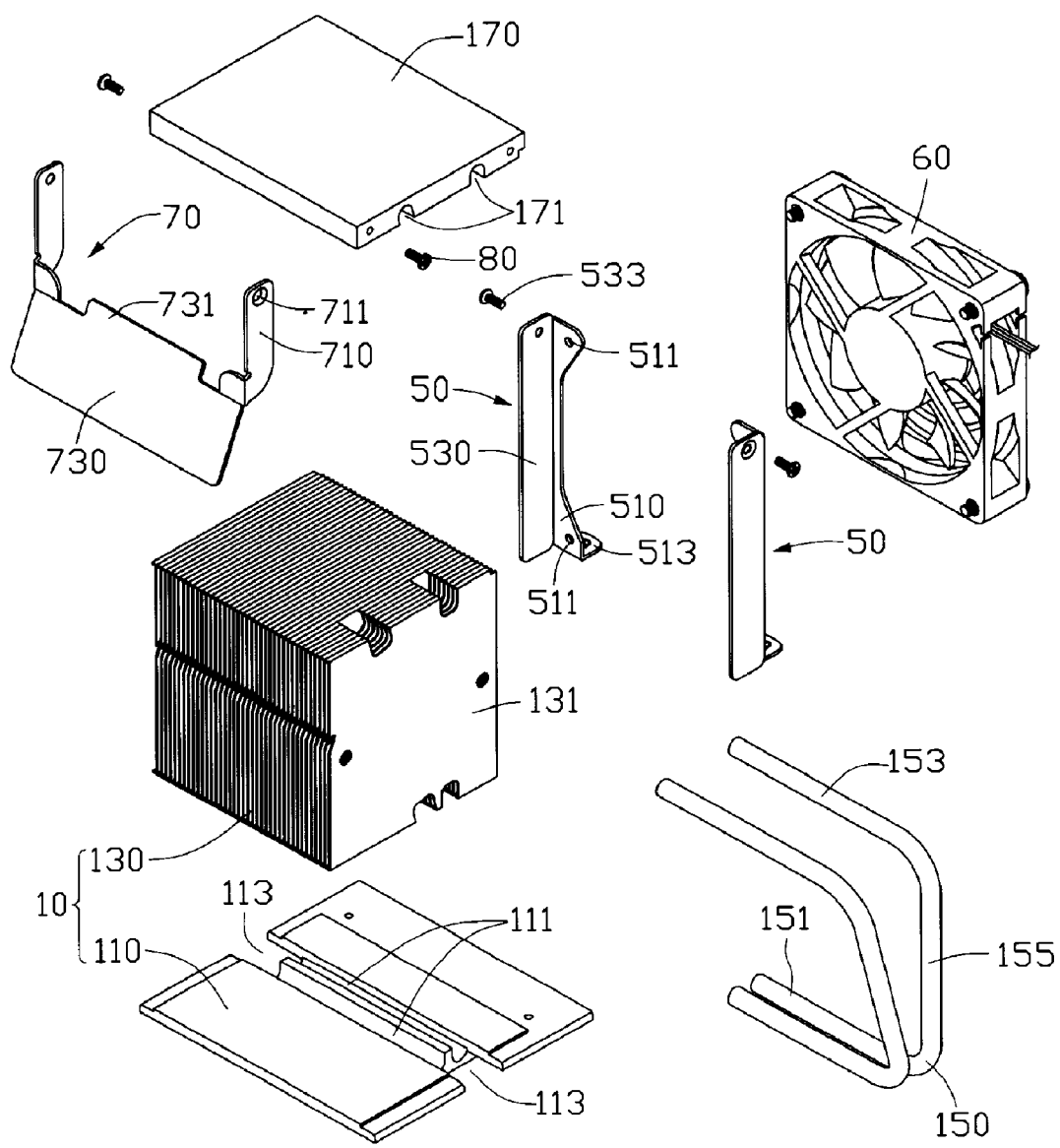
FIG. 1 is an exploded, isometric view of a heat dissipation device in accordance with a preferred embodiment of the present invention.

Referring to FIG. 1, a heat dissipation device in accordance with a preferred embodiment of the present invention is used for dissipating heat generated by electronic devices (not shown) in a computer enclosure (not show). The heat dissipation device comprises a heat sink 10, a fan holder (not labeled) for being attached to the heat sink 10, a fan 60 for being mounted on the fan holder to provide forced airflow to the heat sink 10, and an air guiding member 70 for being attached to the heat sink 10.

Figure 2:
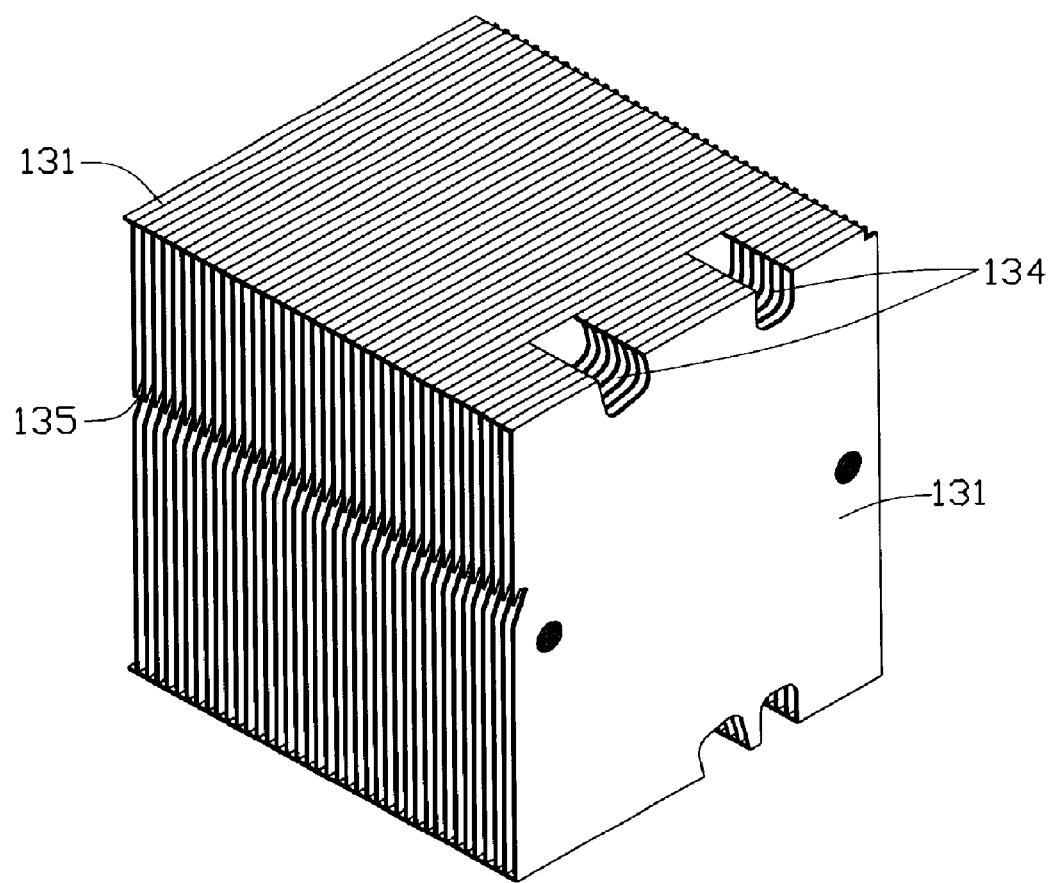
FIG. 2 shows a fin set of the heat dissipation device of FIG. 1.
Figure 3:
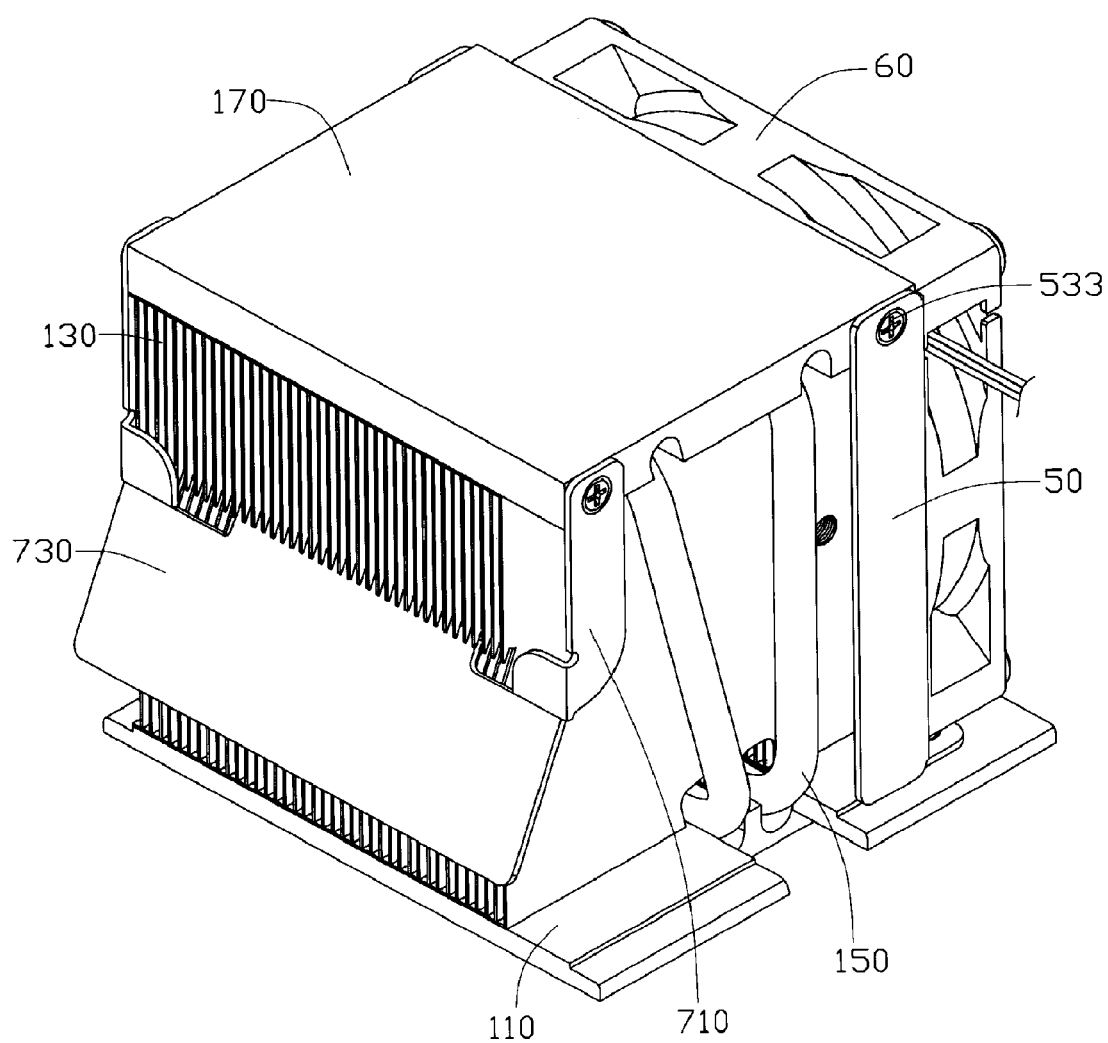
FIG. 3 is an assembled view of FIG. 1.
Figure 4:
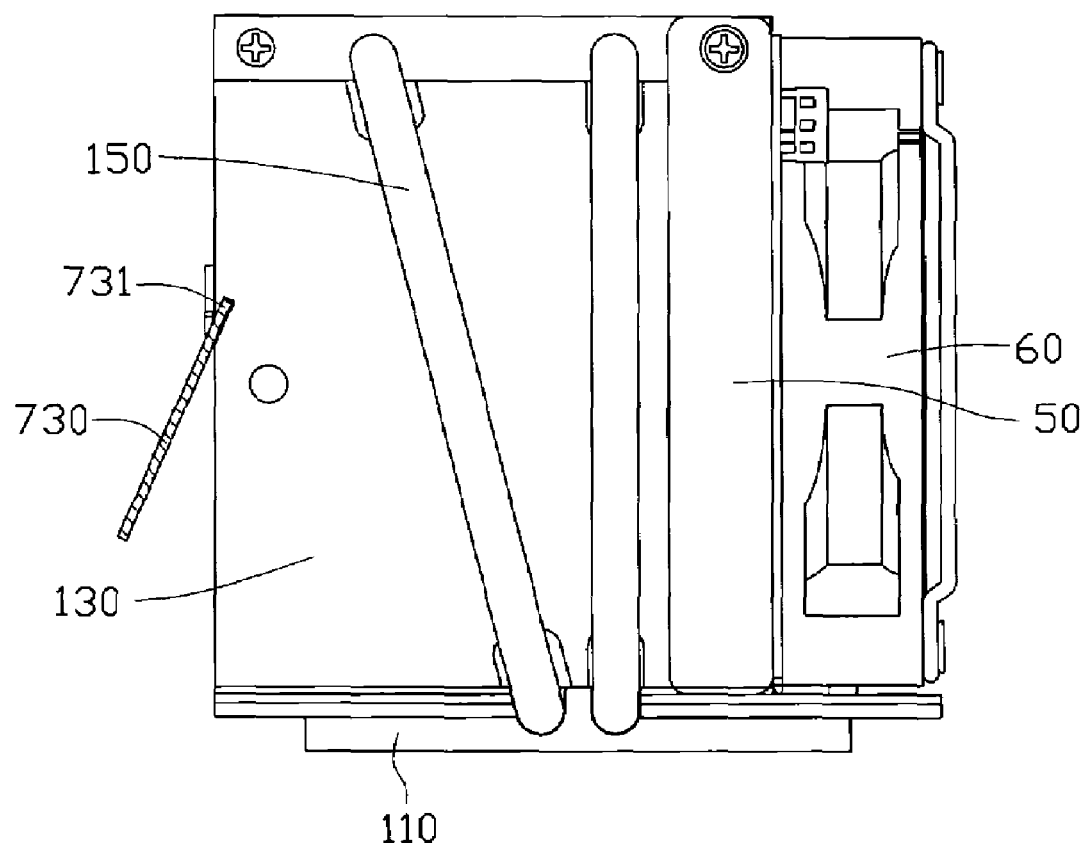
FIG. 4 is a partially-cutaway side view of the heat dissipation device of FIG. 3.

Referring also to FIGS. 2-4, the heat sink 10 comprises a base 110 and a fin set 130 arranged on a top face of the base 110. The base 110 has a higher portion (not labeled) and a lower portion (not labeled) aside the higher portion. The higher portion of the base 110 defines two parallel elongated grooves 111 in a top face thereof. Corresponding to two ends of the two grooves 111, the base 110 defines two cutouts 113. Two substantially U-shaped heat pipes 150 each comprise a first section 151, a second section 153 substantially parallel the first section 151, and a connecting section 155 interconnecting the first and second sections 151, 153. A round corner is formed at each joint of the first, connecting and second sections 151, 155, 153 of each heat pipe 150. The first sections 151 of the two heat pipes 150 are received in corresponding grooves 111 of the base 110. The fin set 130 comprises a plurality of fins (not labeled) assembled together. A plurality of passageways (not labeled) is defined between adjacent fins of the fin set 130. Each fin comprises a body 131 and top, bottom flanges 133 perpendicularly extending from top, bottom edges of the body 131, respectively. The top, bottom flanges 133 of the fins cooperatively form corresponding top, bottom planes (not labeled). The bottom plane of the fin set 130 contacts to the lower portion of the base 110. The top plane of the fin set 130 has the second sections 153 of the two heat pipes 150 located thereon. Corresponding to the joints of the connecting sections 155 and the second sections 153 of the two heat pipes 150, the fin set 130 defines two concaves 134 therein. A ceiling plate 170 is positioned on the top plane of the fin set 130. Corresponding to the second sections 153 of the two heat pipes 150, the ceiling plate 170 defines two elongated grooves 171 accommodating the second sections 153 therein.

The fan holder comprises a pair of brackets 50 each having a holding body 510 and a positioning plate 530 perpendicularly extending from a lateral edge of the holding body 510. The body 510 defines two mounting holes 511 adjacent to upper and lower ends thereof. A fixing foot 513 with a fixing hole (not labeled) defined therein extends outwardly from the lower ends of the brackets 50. The two brackets 50 are positioned to two sides of the fin set 130, with the holding bodies 510 of the two brackets 50 being attached to a lateral face of the fin set 130. Two screws (not labeled) are used to engage the fixing feet 513 with the lower portion of the base 110. The positioning plates 530 are attached to corresponding front, rear faces of the fin set 130 via two screws 533 engaging with top ends of the positioning plates 130 and the ceiling plate 170. The fan 60 is fixed to the holding bodies 510 by a plurality of screws (not labeled). The two brackets 50 define an opening (not labeled) exposed to the fan 60 and in communication with the passageways of the fin set 130 of the heat sink 10.

The guiding member 70 is positioned at a lateral side of the fin set 130 opposite to the fan 60. The guiding member 70 comprises a pair of mounting arms 710 and a guiding plate 730 interconnecting lower ends of the mounting arms 710. Each mounting arm 710 defines a position hole 711 at an upper end thereof. The guiding plate 730 extends from the mounting arms 710 downwardly and outwardly. The guiding plate 730 further extends a tongue 731 at an upper edge thereof and located between the pair of mounting arms 710.

Corresponding to the tongue 731 of the guiding member 70, the body 310 of each fin of the fin set 130 defines a cuneal notch (not labeled) therein. The notches of the fin set 130 cooperatively define a cuneal slot 135 receiving the tongue 731 therein. The two fixing arms 710 of the guiding member 70 are positioned at the rear and frond sides of the fin set 130 correspondingly, and clamping an upper portion of the fin set 130 therebetween. Two screws 80 extend through the mounting holes 711 and engage into corresponding screw holes (not labeled) defined in the ceiling plate 170 of the heat sink 10, thereby fixing the guiding member 70 to the heat sink 10, with the guiding plate 730 tilts away from the slot 135 of the fin set 130 of the heat sink 10.

In use, the base 110 of the heat sink 10 contacts one heat generating electronic device such as a CPU to absorb heat therefrom. A portion of the heat in the base 110 is directly transferred to a lower portion of the fin set 130. The other portion of the heat in the base 110 is absorbed by the first sections 151 of the heat pipes 150 and subsequently reaches the upper portion the fin set 130 and the ceiling plate 170 via the connecting sections 155 and the second sections 153 of the heat pipes 150. The fan 60 works and provides forced airflow to the fin set 130. The airflow passes through the passageways of the fin set 130 and removes the heat in the fins. At the lateral side of the fin set 130, a portion of the airflow out of the fin set 130 is guide by the guiding plate 730 downwardly to blow other heat generating components located aside the CPU; therefore, the heat generated by the other generating components is also removed by the heat dissipation device.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
    a heat sink comprising a plurality of fins defining a plurality of passageways therebetween, the passageways having an inlet and an outlet;
    a fan located at the inlet of the passageways of the heat sink for providing airflow to the heat sink;
    a guiding member positioned at the outlet of the passageways of the heat sink for guiding the airflow to electronic components around the heat dissipation device;
    wherein the heat sink defines a slot at a side thereof, the guiding member extends at least a fixing arm fixed to the heat sink and a tongue embedded into the slot of the heat sink, thereby attaching the guiding member to the heat sink.

2. The heat dissipation device of claim 1, wherein the guiding member comprises a guiding plate extending downwardly and outwardly from the heat sink, the tongue integrally extending upwardly from the guiding plate.

3. The heat dissipation device of claim 2, wherein the guiding member comprises another fixing arm fixed to the heat sink, respectively, the guiding plate integrally connecting the fixing arms.

4. The heat dissipation device of claim 3, wherein the guiding plate descends from the two fixing arms and confronts the outlet of the passageways of the heat sink.

5. The heat dissipation device of claim 3, wherein each of the fins of the heat sink defines a notch in a lateral edge thereof, the notches of the fins of the heat sink cooperatively define the slot receiving the tongue of the guiding member.

6. The heat dissipation device of claim 1, wherein the heat sink comprises a base for absorbing heat from a heat generating device, the fins are thermally arranged on the base.

7. The heat dissipation device of claim 6 further comprising at least a heat pipe for transferring heat from the base to the fins.

8. The heat dissipation device of claim 7, wherein the at least a heat pipe comprises a first section positioned between the base and the fins, a second section extending away the base and thermally contacting the fins.

9. The heat dissipation device of claim 1 further comprising a ceiling plate located on the fins, wherein the at least a fixing arm of the guiding member is fixed to the ceiling plate.

10. A heat dissipation device comprising:
    a base for absorbing heat from a heat generating device;
    a fin set comprising a plurality of fins arranged on the base, a plurality of passageways defined between the fins, a slot being defined in a side of the fin set at ends of the passageways;
    a fan attached to a side of the fin set opposite to the slot for providing airflow to the fin set; and
    an air guiding member having an engaging portion engaging into the slot of the fin set for guiding airflow which flows out of the fin set to blow to electronic component around the heat generating device.

11. The heat dissipation device of claim 10 further comprising a ceiling plate positioned on the fin set, wherein the guiding member comprises two fixing arms fixed to the ceiling plate by two fasteners.

12. The heat dissipation device of claim 11, wherein the guiding member comprises a guiding plate extending downwardly and outwardly from the slot of the heat sink, the engaging portion integrally extending from the guiding plate.

13. The heat dissipation device of claim 12, wherein the guiding member is integrally made from a one-piece plate, the two fixing arms integrally extending from the guiding plate.

14. The heat dissipation device of claim 10 further comprising at least a heat pipe thermally connecting the base and the fin set.

15. The heat dissipation device of claim 10, wherein the slot is cuneal.

* * * * *